(12) United States Patent  
Matsuo et al.

(10) Patent No.: US 8,554,160 B2
(45) Date of Patent: Oct. 8, 2013

(54) AM TRANSMITTER AND MODULATION METHOD USING SAME

(75) Inventors: Shin-ichi Matsuo, Osaka (JP); Hirokazu Iwata, Osaka (JP); Fuminori Kinugawa, Osaka (JP)

(73) Assignee: ICOM Incorporated, Osaka (JP)

( * ) Notice: Subject to any disclaimer, the term of this patent is extended or adjusted under 35 U.S.C. 154(b) by 787 days.

(21) Appl. No.: 12/130,709

(22) Filed: May 30, 2008

(65) Prior Publication Data

US 2009/0111396 A1 Apr. 30, 2009

(30) Foreign Application Priority Data

Oct. 31, 2007 (JP) ................................. 2007-284132

(51) Int. Cl.
*H03C 1/52* (2006.01)
*H01Q 11/12* (2006.01)
*H04B 1/04* (2006.01)

(52) U.S. Cl.
USPC ...................... 455/127.1; 455/108; 455/127.2

(58) Field of Classification Search
USPC .......................... 455/108, 114.2–115.3, 126, 455/127.1–127.4
See application file for complete search history.

(56) References Cited

U.S. PATENT DOCUMENTS

| | | | |
|---|---|---|---|
| 3,961,287 A | | 6/1976 | Cacciola et al. |
| 4,412,337 A | | 10/1983 | Bickley et al. |
| 5,432,473 A | * | 7/1995 | Mattila et al. ................. 330/133 |
| 5,892,396 A | * | 4/1999 | Anderson et al. ............. 330/129 |
| 6,519,293 B1 | * | 2/2003 | Miyake ......................... 375/297 |
| 6,968,163 B2 | * | 11/2005 | Kuechler et al. .............. 455/126 |
| 6,993,090 B2 | * | 1/2006 | Kusunoki ...................... 375/296 |
| 7,024,167 B2 | * | 4/2006 | Marque-Pucheu ............ 455/108 |
| 7,082,290 B2 | * | 7/2006 | Takano et al. ................. 455/102 |
| 7,110,727 B2 | * | 9/2006 | Dekker ............................ 455/91 |
| 7,215,972 B2 | * | 5/2007 | Premakanthan et al. ...... 455/522 |
| 7,317,757 B2 | * | 1/2008 | Sivadas et al. ................. 375/229 |
| 7,418,244 B2 | * | 8/2008 | Montalvo ................... 455/127.2 |
| 7,450,921 B2 | * | 11/2008 | Arayashiki et al. ............ 455/260 |
| 7,542,741 B2 | * | 6/2009 | Rozenblit et al. .......... 455/127.2 |
| 7,724,837 B2 | * | 5/2010 | Filimonov et al. ............ 375/295 |

(Continued)

FOREIGN PATENT DOCUMENTS

| | | |
|---|---|---|
| EP | 1017162 A2 | 7/2000 |
| JP | S63-072942 | 5/1988 |

OTHER PUBLICATIONS

Extended Search Report of corresponding European patent application EP08011803.7.

*Primary Examiner* — Simon Nguyen
(74) *Attorney, Agent, or Firm* — Baker & McKenzie LLP

(57) ABSTRACT

An AM (Amplitude-Modulated) transmitter capable of improving modulation distortion is provided. An adder adds a modulation signal to a pre-set power reference signal. An APC (Automatic Power Control) amplifier compares a level of a detecting signal outputted by the LPF (Low Pass Filter) with a level of an adder signal. The APC amplifier, based on the comparison result, generates a gain controlling signal that makes a difference between a level of the detecting signal and level of the signal approach zero and feeds the gain controlling signal to a power amplifier. The power amplifier modulates the signal outputted from the amplifier by the gain controlling signal and power-amplifies the modulated signal according to a level of the gain controlling signal. Since the APC amplifier feeds the gain controlling signal to the power amplifier, a modulation degree does not depend on a nonlinear distortion characteristic of the power amplifier.

4 Claims, 4 Drawing Sheets

(56) References Cited

U.S. PATENT DOCUMENTS

| | | | |
|---|---|---|---|
| 7,783,269 B2* | 8/2010 | Vinayak et al. | 455/126 |
| 7,873,332 B2* | 1/2011 | Behzad | 455/126 |
| 7,873,334 B2* | 1/2011 | Itkin et al. | 455/126 |
| 2002/0045429 A1* | 4/2002 | Persson | 455/127 |
| 2005/0208907 A1* | 9/2005 | Yamazaki et al. | 455/126 |
| 2005/0280471 A1 | 12/2005 | Matsushita et al. | |
| 2006/0057979 A1* | 3/2006 | Ho et al. | 455/127.1 |
| 2006/0217083 A1* | 9/2006 | Braithwaite | 455/114.3 |
| 2006/0267688 A1 | 11/2006 | Tanoue et al. | |
| 2007/0238424 A1* | 10/2007 | Okada et al. | 455/126 |
| 2009/0068966 A1* | 3/2009 | Drogi et al. | 455/127.1 |

* cited by examiner

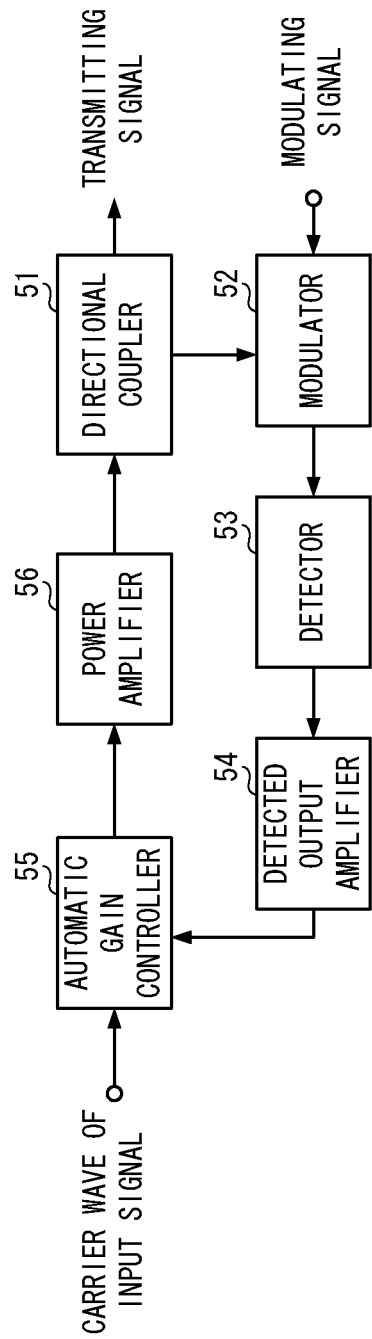

AM TRANSMITTER AND MODULATION METHOD USING SAME

RELATED APPLICATION

This application is based on Japanese Patent Application No. 2007-284132 filed on Oct. 31, 2007 and including specification, claims, drawings and summary. The disclosure of the above Japanese Patent Application is incorporated herein by reference in its entirety.

BACKGROUND OF THE INVENTION

1. Field of the Invention

The present invention relates to an AM (Amplitude-Modulated) transmitter and to a modulation method using the same.

2. Description of the Related Art

A conventional AM transmitter is disclosed in, for example, Unexamined Japanese Utility Model Application KOKAI Publication No. S63-72942 (page 3-4, FIG. 1) which is configured to modulate a transmitting signal to be outputted and to detect a nonlinear distortion by signal detection and to make variable a level of an input signal to a power amplifier using a gain controller for feedback.

The disclosed AM transmitter, as shown in FIG. 3, includes a directional coupler 51, a modulator 52, a detector 53, a detected output amplifier 54, an automatic gain controller 55, and a power amplifier 56.

The directional coupler 51 is configured to make a carrier wave component fed by the power amplifier 56 branch and to supply the branched carrier wave to the modulator 52. The modulator 52 is configured to amplitude-modulate, using a modulating signal, the carrier wave component supplied from the modulator 52. The detector 53 is configured to detect the modulated signal which is amplitude-modulated by the modulator 52.

The detected output amplifier 54 is configured to amplify a detecting signal resulting from the detection by the detector 53 up to a specified level and to feed the amplified detecting signal to the automatic gain controller 55. The automatic gain controller 55 is configured to control a level of a carrier wave of an input signal to be inputted to the power amplifier 56 according to an output from the detected output amplifier 54.

However, in the conventional AM transmitter, as shown in FIG. 3, the automatic gain controller 55 to perform modulation is mounted in the front stage of the power amplifier 56. As a result, the modulation distortion of a transmitted output depends greatly on linearity of the power amplifier 56.

For example, as shown in FIG. 4, in the AM transmitter having an output power of 1 W occurring at a non-modulation time, at a time of 100% modulation, an output power of 4 W is required. That is, it is necessary that input-output power characteristics provided by the power amplifier 56 exhibit linearity till its output power reaches 4 W.

However, in reality, since the power amplifier 56 has a nonlinear distortion, in order to obtain an output power of 4 W, the power amplifier 56 that can provide an output power of, for example, 8 W is required.

That is, in order to improve a modulation distortion appearing when deep modulation is performed, the power amplifier 56 providing large peak power is required. If the power amplifier 56 providing such large peak power is applied to the AM transmitter, its miniaturization is made difficult and, in a small-sized AM transmitter in particular, the use of such the power amplifier causes disadvantages.

Moreover, in the AM transmitter disclosed in the Unexamined Japanese Utility Model Application KOKAI Publication No. S63-72942, by modulating a carrier wave component of a transmitting signal and by performing detection, a difference among nonlinear components in the power amplifier 56 is calculated and by controlling a level of a carrier wave to be inputted to the power amplifier 56, the nonlinear distortion is compensated for.

The modulator 52 modulates a carrier wave made to branch by the directional coupler 51, and furthermore, the automatic gain controller 55 modulates a carrier wave of an input signal. This causes complicated configurations of the AM transmitter.

SUMMARY OF THE INVENTION

With respect to the above conventional problems, an object of the present invention is to provide an AM transmitter capable of improving a modulation distortion and a modulation method to be executed by the AM transmitter.

To achieve the object, according to the first aspect of the present invention, there is provided an AM transmitter including an amplifying unit to be fed with a gain controlling signal indicating a gain and to modulate a carrier wave by the gain controlling signal and to amplify the modulated signal according to the fed gain controlling signal and to output a transmitting signal, a detecting signal generating unit to detect the transmitting signal outputted by the amplifying unit to generate a detecting signal, and a gain controlling unit to be fed with a modulating signal and to compare a level of the detecting signal generated by the detecting signal generating unit with a level of the modulating signal and, based on the comparison result, to generate the gain controlling signal and to feed the generated gain controlling signal to the amplifying unit.

The above gain controlling unit compares a level of the detecting signal generated by the detecting signal generating unit with a level of a modulating signal and, based on the comparison result, generates a gain controlling signal that makes a difference between a level of the modulating signal and a level of the detecting signal approach zero.

The above amplifying unit is made up of a first amplifying unit and a second amplifying unit and wherein the first amplifying unit modulates and amplifies the carrier wave according to the gain controlling signal generated by the gain controlling unit and outputs a first transmitting signal and wherein the second amplifying unit modulates and amplifies the first transmitting signal based on the gain controlling signal generated by the gain controlling unit and outputs a second transmitting signal, and wherein the detecting signal generating unit detects the second transmitting signal outputted by the second amplifying unit to generate a detecting signal.

The above AM transmitter further has low-pass filters provided between the second amplifying unit and the detecting signal generating unit and between the detecting signal generating unit and the gain controlling unit.

According to the second aspect of the present invention, there is provided a modulation method to be executed by an AM transmitter having an amplifying unit, a detecting signal generating unit, and a gain controlling unit including an outputting step of the amplifying unit modulating a carrier wave by a gain controlling signal indicating a gain and amplifying the modulated signal according to the gain controlling signal and outputting a transmitting signal, a generating step of the detecting signal generating unit detecting the transmitting signal to generate a detecting signal, and a controlling step of the gain controlling unit being fed with a modulating signal to modulate the carrier wave and comparing a level of the generated detecting signal with a level of the modulating signal and, based on the comparison result, generating the gain controlling signal and, based on the generated gain controlling signal, controlling the gain.

With the above configurations and method, the AM transmitter of the present invention is capable of improving a modulation distortion.

BRIEF DESCRIPTION OF THE DRAWINGS

These objects and other objects and advantages of the present invention will become more apparent upon reading of the following detailed description and the accompanying drawings in which:

FIG. 3 is a diagram showing configurations of the conventional AM transmitter.

DETAILED DESCRIPTION OF THE PREFERRED EMBODIMENT

Figure 1:
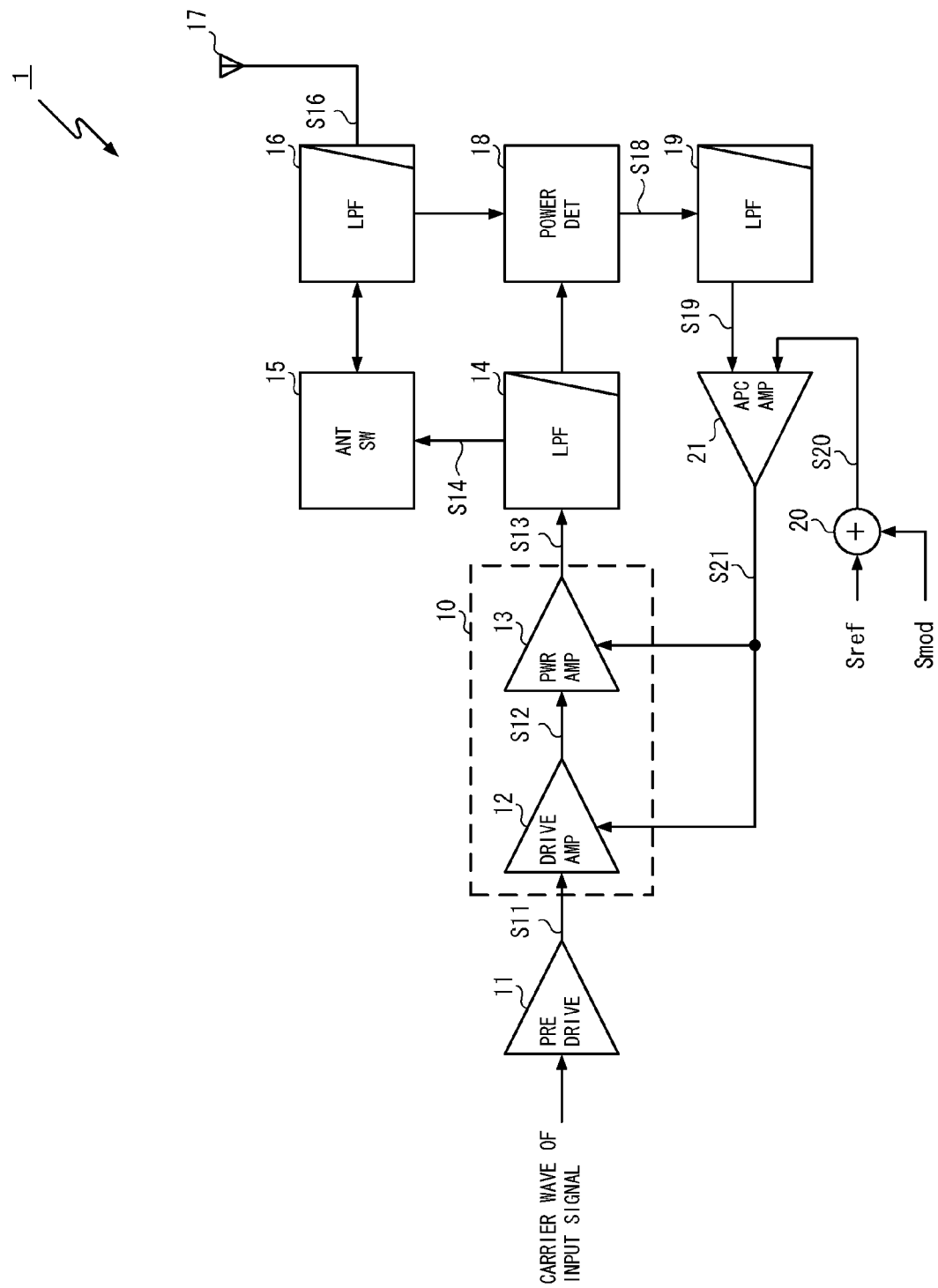
FIG. 1 is a block diagram showing configurations of an AM transmitter according to an embodiment of the present invention.

The AM transmitter of an embodiment of the present invention is described below by referring to drawings. The configurations of the AM transmitter of the embodiment are shown in FIG. 1. The AM transmitter 1 of the embodiment of the present invention includes an amplifier (in FIG. 1, referred to as "PRE DRIVE") 11, an amplifier (in FIG. 1, referred to as "DRIVE AMP") 12, a power amplifier (in FIG. 1, referred to as "PWR AMP") 13, LPFs (Low Pass Filters) 14, 16, and 19, an antenna switch (in FIG. 1, referred to as "ANT SW") 15, an antenna 17, a power detector (in FIG. 1, referred to as "POWER DET") 18, an adder 20 and an APC (Automatic Power Control) amplifier (in FIG. 1, referred to as "APC AMP") 21. An amplifier unit 10 includes the amplifiers 12 and 13.

The amplifiers 11 and 12 are used to excite the power amplifier 13 mounted in the final stage of the AM transmitter 1 which is required to obtain a specified antenna output. The amplifier 11 is supplied with a carrier wave of an input signal and is configured to amplify the supplied carrier wave of the input signal and outputs the amplifying signal S11 to the amplifier 12.

The amplifier 12 is supplied, by the APC amplifier 21 described later, with a gain controlling signal S21 to control a gain and is configured to amplitude-modulate the signal S11 output from the amplifier 11 according to the gain controlling signal S21 and to amplify the amplitude-modulated signal and to output the amplified signal S12 to the power amplifier 13.

The power amplifier 13 is supplied, by the APC amplifier, with the gain controlling signal S21 and is configured to modulate the signal S12 outputted by the amplifier 12 by the gain controlling signal S21 and to power-amplify the modulated signal and to output the power-amplified signal to the LPF 14 as a transmitting signal S13.

The LPF 14 has a cut-off frequency set in advance and is a filter which removes a component having a frequency being higher than the cut-off frequency from the transmitted signal S13 outputted from the power amplifier 13 and outputs a transmitting signal S14 from which a high-frequency component had been removed to the antenna switch 15.

The antenna switch 15 is a switch to select either of a receiving signal or a transmitting signal to be outputted. In the example, the transmitting signal S14 outputted by the LPF 14 is selected and outputted to the LPF 16.

The LPF 16 has a cut-off frequency set in advance and is a filter which removes a component having a frequency being higher than the cut-off frequency from the signal S14 selected and outputted by the antenna switch 15 and outputs a transmitting signal S16 obtained by removing a high-frequency component to the antenna 17.

The antenna 17 sends out the transmitting signal S16 outputted by the LPF 16 as a radio wave.

The power detector 18 detects an amplitude-modulated component obtained by removing a carrier wave component from the transmitting signal S16 outputted by the LPF 16 and feeds a detecting signal S18 being an amplitude-modulated component of the transmitted signal S16 to the LPF 19.

The LPF 19 has a cut-off frequency set in advance and is a filter which removes a component having a frequency being higher than the cut-off frequency from the detected signal S18 outputted by the power detector 18 and outputs the signal obtained by removing a high-frequency component to the APC amplifier 21 as a detecting signal S19.

A cut-off frequency is set to the LPF 19 that follows a change of the detecting signal S18.

The adder 20 adds a modulated signal Smod to a preset power reference signal Sref and feeds the added signal S20 to the APC amplifier 21. The APC amplifier 21 outputs a gain controlling signal S21 to the amplifier 12 and power amplifier 13 and controls gains of the amplifier 12 and the power amplifier 13.

The APC amplifier 21 is supplied with the signal S20 from the adder 20 and with the detecting signal S19 from the LPF 19.

The APC amplifier 21 compares the detecting signal S19 outputted from the LPF 19 with the signal S20 to improve nonlinear distortion of the power amplifier 13. The APC amplifier 21, based on the above comparison result, generates the gain controlling signal S21 that makes a difference between a level of the modulated signal Smod and a level of the detecting signal S19 approach zero.

Operations of the AM transmitter 1 of the embodiment of the present invention are described. The carrier wave of an input signal is fed to the amplifier 11 which amplifies the carrier wave of the input signal and outputs the signal S11 to the amplifier 12.

The amplifier 12 modulates the signal S11 outputted from the amplifier 11 according to the gain controlling signal S21 outputted from the APC amplifier 21 and amplifies the modulated signal and outputs the amplified signal S12 to the power amplifier 13.

The power amplifier 13 modulates the signal S12 outputted from the amplifier 12 according to the gain controlling signal S21 outputted from the APC amplifier 21 and amplifies the modulated signal to outputs the signal to the LPF 14.

The LPF 14 outputs the transmitting signal S14 obtained by removing high-frequency components from the transmitting signal S13 to the antenna switch 15 and the antenna 17 outputs a transmitting signal S16 obtained by removing high-frequency components from a transmitting signal S14 selected and outputted by the antenna switch 15 as a radio wave.

The power detector 18 outputs a detecting signal S18 being an amplitude-modulated component obtained by removing a carrier wave component from the transmitting signal S16 to the LPF 19 and the LPF 19 removes a high-frequency component from the detecting signal S18 and outputs a detecting signal S19 to the APC amplifier 21.

The cut-off frequency of the LPF 19 is set at a frequency that follows a change of the detecting signal S18. Therefore, the LPF 19 outputs the detecting signal S19 obtained by removing only the unwanted high-frequency noise component contained in the detecting signal S18 to the APC amplifier 21.

The adder 20 adds the modulated signal Smod to the pre-set power reference signal Sref and outputs an adder signal S20 obtained by the addition to the APC amplifier 21.

The APC amplifier 21 compares a level of the signal S20 fed from the adder 20 with a level of the detected signal S19 outputted by the LPF 19 that follows the detected signal S18 and, based on the comparison result, generates a gain controlling signal S21 that makes a difference between a level of the signal S20 and a level of the detected signal S19 that followed the detected signal S18 approach zero. Then, the APC amplifier 21 sets a level of the gain controlling signal S21 and outputs the level to the amplifier 12 and the power amplifier 13.

In the conventional AM transmitter, an amplitude-modulated signal is outputted as a transmitting signal via the power amplifier 56 having a nonlinear distortion characteristic. As a result, the amplitude-modulated signal is affected by the nonlinear distortion characteristic of the power amplifier 56.

Figure 2A:
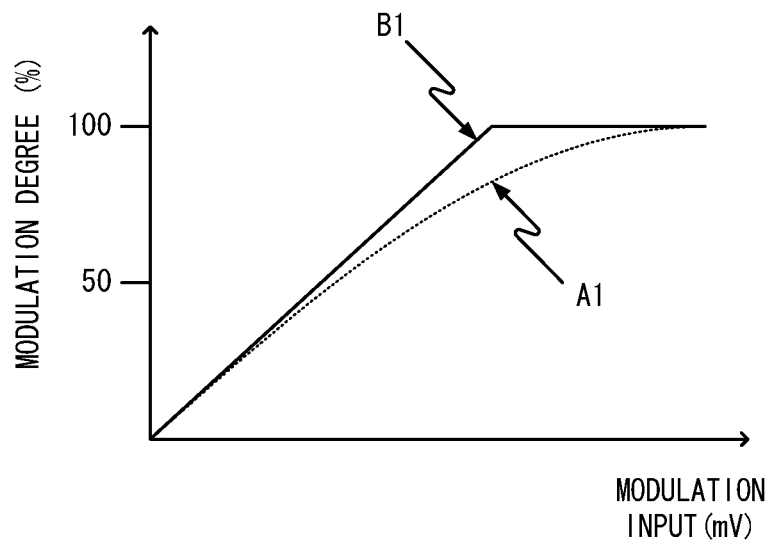
FIGS. 2A and 2B are diagrams comparing characteristics between a conventional AM transmitter and the AM transmitter of the embodiment of the present invention and FIG. 2A is a diagram showing a relation between a modulation input and modulation degree and FIG. 2B is a diagram showing a relation between a modulation degree and modulation distortion.
Figure 2B:
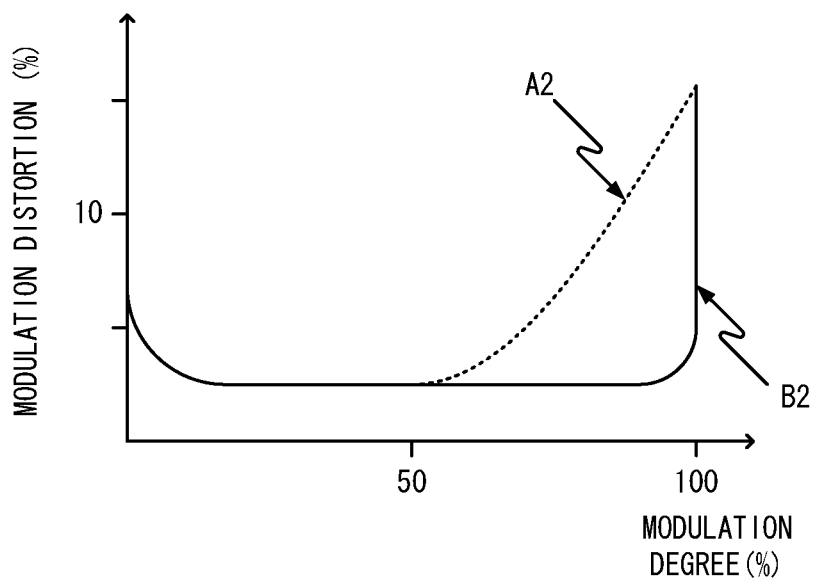
Figure 4:
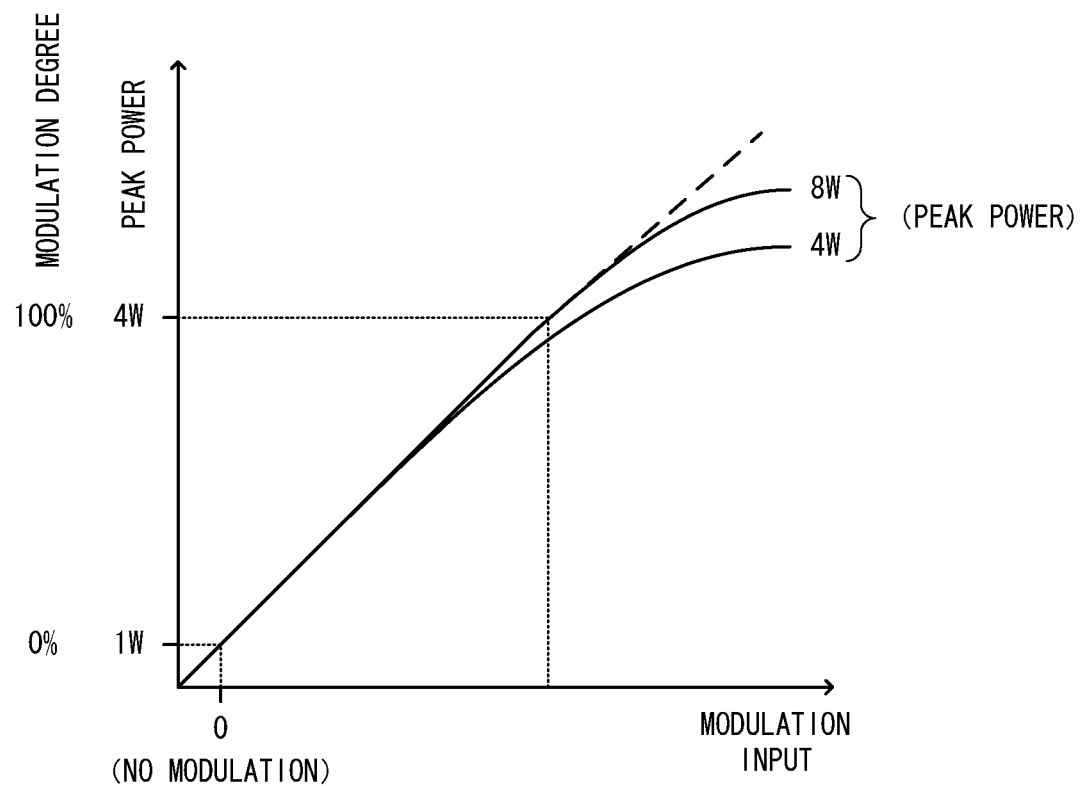
FIG. 4 is a diagram showing a relation among a modulation input, peak power, and modulation degree of the conventional AM transmitter.

Therefore, as shown by the characteristic line A1 in FIG. 2A, as a modulation input becomes large, the modulation degree becomes small due to the nonlinear distortion characteristic of the power amplifier 56 and, as shown by the characteristic line A2 in FIG. 2B, as the modulation degree becomes larger, the modulation distortion becomes large.

In the AM transmitter of the embodiment of the present invention, the amplifier 12 and the power amplifier 13 amplitude-modulate and amplify the carrier wave according to the gain controlling signal S21 fed from the APC amplifier 21.

That is, unlike the conventional AM transmitter in which, the amplitude-modulated signal, after being amplified by the power amplifier 13 once, is outputted, according to the embodiment of the present invention, an operation of variable gain amplification of the power amplifier 13 itself serves as an amplitude-modulation and power amplification.

Therefore, as shown by the characteristic line B1 in FIG. 2A, a curve of the modulation degree in the AM transmitter 1 of the embodiment of the present invention is linear relative to modulation inputs till the degree reaches 100%.

As a result, in the embodiment of the present embodiment, as shown by the characteristic line B2 in FIG. 2B, the modulation distortion remains almost unchanged till the modulation degree reaches 100%.

As described above, according to the embodiment of the present invention, both the detecting signal and modulating signal are fed to the APC amplifier 21 which compares the fed detecting signal with the modulating signal and provides an amplification control signal that makes the difference approach zero to the power amplifier 13.

Therefore, the modulation degree does not depend on a nonlinear distortion characteristic of the power amplifier 13 and, even when signals are deeply modulated, no increase occurs in the modulation distortion, resulting in the improvement of the modulation distortion.

Also, since the amplitude-modulation is performed by the amplifier 12 and the power amplifier 13, no modulator is required. That is, it is made possible to transmit a transmitting signal with less modulation distortion with reduced parts count. Therefore, in the small-sized AM transmitter in particular, advantages can be achieved.

Moreover, in the embodiment of the present invention, the amplitude-modulation is performed by the amplifier 12 and power amplifier 13, however, the amplitude-modulation may be performed only by the power amplifier according to specifications of a transmitter and performance of a power amplifier. Furthermore, the number of stages of the amplifiers mounted in the front stage of the power amplifier 13 can be changed as appropriate.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. An AM (Amplitude-Modulated) transmitter comprising:
   an amplifying unit configured to receive a gain controlling signal, to modulate a carrier wave by using the gain controlling signal, to amplify the modulated signal according to the gain controlling signal, and to output a transmitting signal;
   a detecting signal generating unit configured to detect the transmitting signal output by the amplifying unit and to generate a detecting signal upon detecting the transmitting signal; and
   a gain controlling unit configured to receive a modulating signal having a level independent from a level of a receiving signal, to compare a level of the detecting signal with a level of an added signal generated by an addition of a reference signal and the modulating signal, based on the comparison, to generate the gain controlling signal, and to transmit the generated gain controlling signal to the amplifying unit,
   wherein the gain controlling unit is further configured to determine a difference between a level of the detecting signal and a level of the added signal, and based on the level difference, to generate a gain controlling signal that makes the level difference approach zero, and
   an operation of variable gain amplification of the amplifying unit to serve as an amplitude-modulation of the carrier wave and power amplification.

2. The AM transmitter according to claim 1, wherein the amplifying unit comprises a first amplifying unit and a second amplifying unit and wherein the first amplifying unit modulates and amplifies the carrier wave according to the gain controlling signal generated by the gain controlling unit and outputs a first transmitting signal and wherein the second amplifying unit modulates and amplifies the first transmitting signal based on the gain controlling signal generated by the gain controlling unit and outputs a second transmitting signal, and wherein the detecting signal generating unit detects the second transmitting signal outputted by the second amplifying unit to generate a detecting signal.

3. The AM transmitter according to claim 2, wherein low-pass filters are provided between the second amplifying unit and the detecting signal generating unit and between the detecting signal generating unit and the gain controlling unit.

4. A modulation method to be executed by an AM transmitter having an amplifying unit, a detecting signal generating unit, and a gain controlling unit comprising:

an outputting step of the amplifying unit modulating a carrier wave by a gain controlling signal and amplifying the modulated signal according to the gain controlling signal and outputting a transmitting signal;
a generating step of the detecting signal generating unit detecting the transmitting signal to generate a detecting signal upon detecting the transmitting signal; and
a controlling step of the gain controlling unit receiving a modulating signal having a level independent from a receiving signal to modulate the carrier wave and comparing a level of the detecting signal with a level of an added signal generated by an addition of a reference signal and the modulating signal and, based on the comparison, generating the gain controlling signal and, based on the generated gain controlling signal, controlling the gain,
wherein the controlling step further comprises determining, with the gain controlling unit, a difference between a level of the detecting signal and a level of the added signal, and based on the level difference, generating a gain controlling signal that makes the level difference approach zero, and
the outputting step further comprises an operation of variable gain amplification, with the amplifying unit, to serve as an amplitude-modulation of the carrier wave and power amplification.

\* \* \* \* \*